(12) United States Patent
Shimozawa

(10) Patent No.: US 9,146,008 B2
(45) Date of Patent: Sep. 29, 2015

(54) LIGHTING DEVICE INCLUDING LIGHT-TRANSMITTING MEMBER

(71) Applicants: CITIZEN ELECTRONICS CO., LTD., Yamanashi-ken (JP); CITIZEN HOLDINGS CO., LTD., Tokyo (JP)

(72) Inventor: Arata Shimozawa, Yamanashi-ken (JP)

(73) Assignees: CITIZEN ELECTRONICS CO., LTD., Yamanashi-Ken (JP); CITIZEN HOLDINGS CO., LTD., Tokyo (JP)

( * ) Notice: Subject to any disclaimer, the term of this patent is extended or adjusted under 35 U.S.C. 154(b) by 0 days.

(21) Appl. No.: 14/689,273

(22) Filed: Apr. 17, 2015

(65) Prior Publication Data
US 2015/0226387 A1    Aug. 13, 2015

Related U.S. Application Data

(63) Continuation of application No. 13/975,574, filed on Aug. 26, 2013, now Pat. No. 9,046,226.

(30) Foreign Application Priority Data

Aug. 27, 2012 (JP) ................................. 2012-186837

(51) Int. Cl.
   H01J 33/00     (2006.01)
   F21K 99/00     (2010.01)
   H01L 25/075    (2006.01)
   H01K 1/02      (2006.01)
   F21V 23/00     (2015.01)
   F21Y 105/00    (2006.01)

(52) U.S. Cl.
   CPC ................ F21K 9/56 (2013.01); F21V 23/002 (2013.01); F21V 23/005 (2013.01); F21Y 2105/001 (2013.01)

(58) Field of Classification Search
   CPC . F21K 9/56; F21Y 2101/02; F21Y 2105/003; H01L 25/0753; H05K 1/021; H05K 2201/10106; H05K 224/48137
   See application file for complete search history.

(56) References Cited

U.S. PATENT DOCUMENTS

2004/0021629 A1    2/2004  Sasuga et al.
2006/0197098 A1    9/2006  Aihara
(Continued)

FOREIGN PATENT DOCUMENTS

EP    2 445 007    4/2012
(Continued)

*Primary Examiner* — Joseph L Williams
(74) *Attorney, Agent, or Firm* — Wenderoth, Lind & Ponack, L.L.P.

(57) ABSTRACT

In a first aspect of the present invention, a lighting device includes a substrate that includes a pair of electrodes as a first electrode and a second electrode, groups each including a same number of light-emitting elements that are electrically connected to one another in series in each group and that are arranged between the first electrode and the second electrode, a first light-transmitting member including a first phosphor and covering at least one light-emitting element and a second light-transmitting member including a second phosphor and covering at least one light-emitting element that is uncovered by the first light-transmitting member, the first phosphor in the first light-transmitting member and the second phosphor in the second light-transmitting member being configured to be excited to emit light with emission spectrum different from each other, and the first light-transmitting member being enclosed by the second light-transmitting member.

23 Claims, 14 Drawing Sheets

(56) References Cited

U.S. PATENT DOCUMENTS

| | | |
|---|---|---|
| 2011/0050071 A1 | 3/2011 | Chung et al. |
| 2011/0116252 A1 | 5/2011 | Agatani et al. |
| 2014/0098529 A1 | 4/2014 | Hata et al. |

FOREIGN PATENT DOCUMENTS

| | | |
|---|---|---|
| JP | 2004-55772 | 2/2004 |
| JP | 2006-245443 | 9/2006 |
| JP | D1349213 | 1/2009 |
| JP | 2012-94865 | 5/2012 |
| WO | 2012/165007 | 12/2012 |

LIGHTING DEVICE INCLUDING LIGHT-TRANSMITTING MEMBER

This application claims the priority benefit under 35 U.S.C. 119 to Japanese Patent Application No. 2012-186837 filed on Aug. 27, 2012, the entire contents of which are hereby incorporated by reference.

BACKGROUND OF THE INVENTION

1. Field of the Invention

The present invention relates to a lighting device, and also relates to a lighting device that includes a light-emitting element and a light-transmitting member including a phosphor and covering the light-emitting element.

2. Description of the Related Art

It is laid open to the public that a light-emitting diode device includes a white light-emitting diode device that includes a blue light-emitting diode and a filter including a phosphor, and a red light-emitting diode. It is also disclosed that a light-emitting diode device includes a blue light-emitting diode and a red light-emitting diode that are mounted on a substrate and sealed by a transparent resin including a phosphor (For reference, see Japanese Unexamined Patent Application Publication No. 2004-055772).

Also, it is laid open to the public that a lighting device includes a blue light-emitting diode, a green light-emitting diode, a yellow phosphor that can be excited by blue light from the blue light-emitting diode, and a red phosphor that can be excited by green light from the green light-emitting diode (For reference, see Japanese Unexamined Patent Application Publication No. 2006-245443).

Furthermore, it is laid open to the public that a multi-chip package structure using a constant voltage power supply. The multi-chip package includes a substrate unit, a light-emitting unit, a current limiting unit, a frame unit, and a package unit. It is disclosed that the substrate unit includes a first chip-placing region and a second chip-placing region. The light-emitting unit includes a plurality of light-emitting chips electrically connected to the first chip-placing region. Also, it is disclosed that the current-limiting unit includes at least one current-limiting chip electrically connected to the second chip-placing region and the light-emitting unit (For reference, see European Unexamined Patent Application Publication No. 2445007, which is an English publication with an earlier publication date in a patent application family, related to Japanese Unexamined Patent Application Publication No. 2012-94865).

SUMMARY OF THE INVENTION

In a first aspect of the present invention, a lighting device includes a substrate including a pair of electrodes as a first electrode and a second electrode, groups each including a same number N of light-emitting elements that are electrically connected to one another in series in each group and that are arranged between the first electrode and the second electrode of the substrate, a first light-transmitting member including a first phosphor and covering at least one light-emitting element, and a second light-transmitting member including a second phosphor and covering at least one light-emitting element that is uncovered by the first light-transmitting member, the first phosphor included in the first light-transmitting member and the second phosphor included in the second light-transmitting member being configured to be excited to emit light with emission spectrum different from each other, and the first light-transmitting member being enclosed by the second light-transmitting member.

It is disclosed that an outline of the second light-transmitting member may coincide with an outline of a light-emitting area.

It is also disclosed that the first electrode and the second electrode may be positioned opposite to each other across the light-emitting area and adjacently positioned to the outline of the light-emitting area.

In a second aspect of the present invention, it is disclosed that the first light-transmitting member may be separately arranged as pieces from one another in the light-emitting area.

In an embodiment, it is disclosed that the pieces of the first light-transmitting member may be arranged in parallel with one another between the first electrode and the second electrode.

It is also disclosed that at least one group that includes the same number N of light-emitting elements electrically connected to one another in series may be covered by one of the pieces of the first light-transmitting member.

Furthermore, it is disclosed that some of the light-emitting elements arranged in two or more groups may be covered by one of the pieces of the first light-transmitting member.

In a third aspect of the present invention, it is disclosed that the lighting device may include a third light-transmitting member including a third phosphor and covering at least one light-emitting element that is uncovered by the first light-transmitting member and the second light-transmitting member.

It is disclosed that the third light-transmitting member may be separately arranged as pieces from one another in the light-emitting area.

In a fourth aspect of the present invention, it is disclosed that the lighting device may include a substrate including a first pair of electrodes that includes a first electrode and a second electrode, and a second pair of electrodes that includes a first electrode and the second electrode.

It is disclosed that the lighting device may include a control circuit that comprises a first terminal electrically connected to the first pair of electrodes and a second terminal electrically connected to the second pair of electrodes.

In a fifth aspect of the present invention, it is disclosed that a lighting device may include a smaller electrode that is smaller in size than a first electrode or a second electrode, and the smaller electrode is positioned among the light-emitting elements arranged in the light-emitting area.

DETAILED DESCRIPTION OF THE EMBODIMENTS

As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes", "including", "has" and/or "having" when used herein, specify the presence of stated features, integers, elements, components, portion of an element, and/or groups but do not preclude the presence or addition of one or more other features, integers, elements, components, portions, and/or groups thereof.

Relative terms such as "below" or "above" or "upper" or "lower" or "upward" or "downward" may be used herein to describe a relationship of one element, portion, surface, area, or direction to another element, portion, surface, area, or direction as illustrated in the figures. It will be understood that these terms are intended to encompass different orientations of a device in addition to the orientation depicted in the figures.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Embodiments of the invention are described with reference to drawings included herewith. Same and/or similar reference numbers refer to same and/or similar structures throughout. It should be noted that the drawings are schematic in nature.

Figure 1:
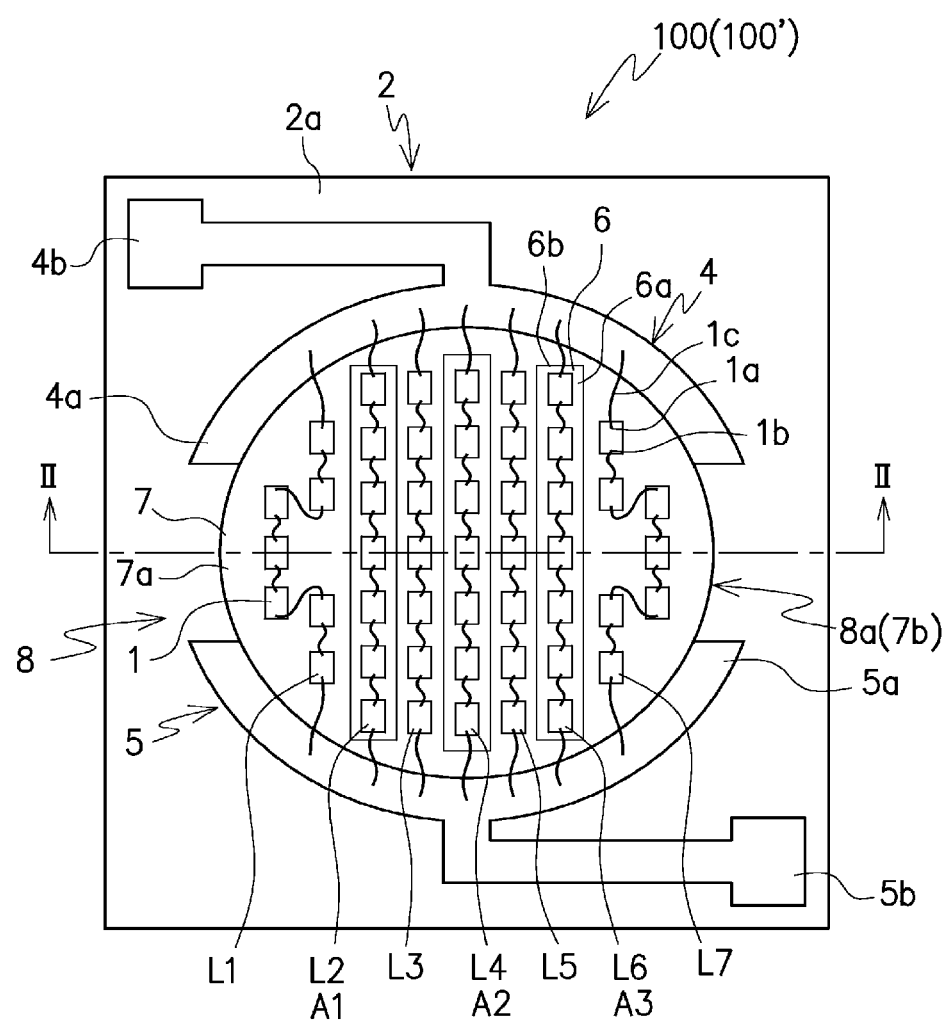
FIG. 1 shows a schematic top plan view of a lighting device according to a first embodiment of the present invention.

FIG. 1 is a schematic top plan view of a lighting device according to a first embodiment of the present invention. A main difference between a lighting device 100 and a lighting device 100' is a configuration of a substrate and explained later with FIG. 2A and FIG. 2B.

A lighting device 100 or 100' includes a substrate 2 including a pair of electrodes as a first electrode 4 and a second electrode 5, groups L1-L7 each including a same number N of light-emitting elements 1 that are electrically connected to one another in series in each group of the groups L1, L2, L3, L4, L5, L6 or L7 and that are arranged between the first electrode 4 and the second electrode 5 of the substrate 2, a first light-transmitting member 6 including a first phosphor 6a and covering at least one light-emitting element 1, and a second light-transmitting member 7 including a second phosphor 7a and covering at least one light-emitting element 1 that is uncovered by the first light-transmitting member 6. The first phosphor 6a included in the first light-transmitting member 6 and the second phosphor 7a included in the second light-transmitting member 7 are configured to be excited to emit light with emission spectrum different from each other. Also, the first light-transmitting member 6 is enclosed by the second light-transmitting member 7.

The first light-transmitting member 6 including the first phosphor 6a is arranged in contact with the second light-transmitting member 7 that includes the second phosphor 7a. The light-emitting elements 1 included in the groups L1-L7 are arranged in a light-emitting area 8. An outline 7b of the second light-transmitting member 7 may coincide with an outline 8a of the light-emitting area 8.

As shown in FIG. 1, the first light-transmitting member 6 can be separately arranged as pieces A1-A3 from one another in the light-emitting area 8. The pieces A1-A3 of the first light-transmitting member 6 are separated by the second light-transmitting member 7 in that the light-emitting elements 1 included in groups L1, L3, L5, and L7. The piece A1 of the first light-transmitting member 6 covers the light-emitting elements 1 arranged in the group L2. The piece A2 of the first light-transmitting member 6 covers the light-emitting elements arranged in the group L4. The piece A3 of the first light-transmitting member 6 covers the light-emitting elements 1 arranged in the group L6.

As shown in FIG. 1, a peripheral side surface 6b of the piece of the first light-transmitting member 6 enclosed by the second light-transmitting member 7 is in contact with the second light-transmitting member 7. The piece of the first light-transmitting member 6 in this embodiment may have an elongated shape covering the light-emitting elements 1 arranged one after another in a line between the first electrode 4 and the second electrode 5. The pieces A1-A3 of the first light-transmitting member 6 are arranged in parallel with one another between the first electrode 4 and the second electrode 5. The piece of the first light-transmitting member 6 may have a rectangular parallelepiped shape extending between the first electrode 4 and the second electrode 5. The piece of the first light-transmitting member 6 may appear to have a rectangular shape, when viewed from above. The second light-transmitting member 7 is filled in a space between the pieces A1-A3 of the first light-transmitting member 6.

With reference to electrical connection of the lighting device 100 or 100', the first electrode 4 and the second electrode 5 arranged on the substrate 2 are positioned opposite to each other across the light-emitting area 8 and adjacently positioned to the outline 8a of the light-emitting area 8. Electrical current can be supplied through the first electrode 4 and the second electrode 5.

For more details about electrical connection, the lighting device 100 or 100' includes groups L1-L7 of light-emitting elements 1. Each group of the groups L1, L2, L3, L4, L5, L6 and L7 has a same number N of light-emitting elements 1 that are electrically connected to one another in series in each group of the groups L1, L2, L3, L4, L5, L6 and L7.

In this embodiment, each group of the groups L1, L2, L3, L4, L5, L6 and L7 has seven light-emitting elements 1 as the same number N of the light-emitting elements. The number N of the light-emitting elements that are electrically connected to one another in series in each group is not limited to the number examples explained herein as embodiments of the present invention. The number N of the light-emitting elements can be set in relation to electrical current value that is available, and in relation to the number of groups each including N light-emitting elements, for example. Accordingly, it is possible to arrange more and/or fewer light-emitting elements 1 in each group of more and/or fewer groups of light-emitting elements 1 in a light-emitting area 8 of the lighting device, considering a shape and/or size of the light-emitting area 8.

As shown in FIG. 1, the seven light-emitting elements in each group of the groups L1, L2, L3, L4, L5, L6 and L7 are electrically connected to one another in series by metallic wires 1c, and electrically connected in series by metallic wires 1c to the first electrode 4 and to the second electrode 5 at two light-emitting elements 1 that are positioned at opposite ends of each group of the groups L1, L2, L3, L4, L5, L6 and L7. Also, it is shown that the groups L1-L7 are electrically arranged in parallel between the first electrode 4 and the second electrode 5.

In this embodiment, electrical contact portions 1a and 1b of the light-emitting element 1 are positioned on the upper surface of the light-emitting element 1 as a first electrical contact portion 1a and a second electrical contact portion 1b.

Accordingly, the electrical contact portions 1a and 1b of the light-emitting elements 1 in each group of the groups L1-L7 can be electrically connected to one another in series by metallic wires 1c, and one light-emitting element 1 adjacently positioned to the first electrode 4 in each group is electrically connected in series to the first electrode 4 by a metallic wire 1c and another light-emitting element 1 adjacently positioned to the second electrode 5 in each group of the groups L1-L7 is electrically connected in series to the second electrode 5 by a metallic wire 1c, as shown in FIG. 1.

Regarding a phosphor included in a light-transmitting member, the first phosphor 6a included in the first light-transmitting member 6 and the second phosphor 7a included in the second light-transmitting member 7 are configured to be excited light from a light-emitting element 1 and to emit light with emission spectrum different from each other.

For example, the first light-transmitting member 6 may include a red phosphor as a first phosphor 6a. The red phosphor 6a can be excited by light from a light-emitting element 1 to emit light with emission spectrum around 630 nm-780 nm, which may appear to be red light. The first light-transmitting member 6 may be made of transparent resin or translucent resin.

Also, for example, the second light-transmitting member 7 may include a green phosphor as a second phosphor 7a. The green phosphor 7a can be excited by light from a light-emitting element 1 to emit light with emission spectrum around 490 nm-560 nm, which may appear to be green light. The second light-transmitting member 7 may be made of transparent resin or translucent resin.

Also, as an embodiment, the light-emitting elements 1 may be blue light-emitting elements that can emit blue light with emission spectrum around 450 nm-490 nm. The first light-transmitting member 6 may include YAG phosphor as well as the red phosphor 6a as the first phosphor. The second light-transmitting member 7 may include YAG phosphor as well as the green phosphor 7a as the second phosphor. The YAG phosphor can be excited by blue light from the light-emitting element 1 to emit yellow light with emission spectrum around 560 nm-590 nm.

Accordingly, color-rendering properties of light to be emitted from the light-emitting area 8 of the lighting device 100 or 100' can be enhanced as a white light with a combination of warm white light from the first light-transmitting member 6 and cool white light from the second light-transmitting member 7. A combination of first phosphor 6a included in the first light-transmitting member 6 and second phosphor 7a included in the second light-transmitting member 7 is not limited to embodiments explained herein. Various combinations of phosphors can be used for a lighting device. Also, there are various light-emitting elements that can emit RGB color of light, for example. Furthermore, it is possible to arrange near ultraviolet light-emitting elements in a light-emitting area 8 as light-emitting elements 1 with various combinations of phosphors.

The first electrode 4 includes a first electrode portion 4a arranged partly along the light-emitting area 8 and a first terminal electrode portion 4b arranged adjacent to a first end of the substrate 2 and electrically connected to the first electrode portion 4a. The second electrode 5 includes a second electrode portion 5a arranged partly along the light-emitting area 8 and a second terminal electrode portion 5b arranged adjacent to a second end of the substrate 2. The first terminal electrode portion 4b and the second terminal electrode portion 5b may be positioned opposite to each other across the light-emitting area 8.

In this embodiment, the light-emitting area 8 is an integration of the first light-transmitting member 6 and the second light-transmitting member 7. The light-emitting area 8 may be circular, when viewed from above. The light-emitting area 8 may be partly overlapped with the first electrode 4 and the second electrode 5, when viewed from above to cover the metallic wires 1c.

Figure 6:
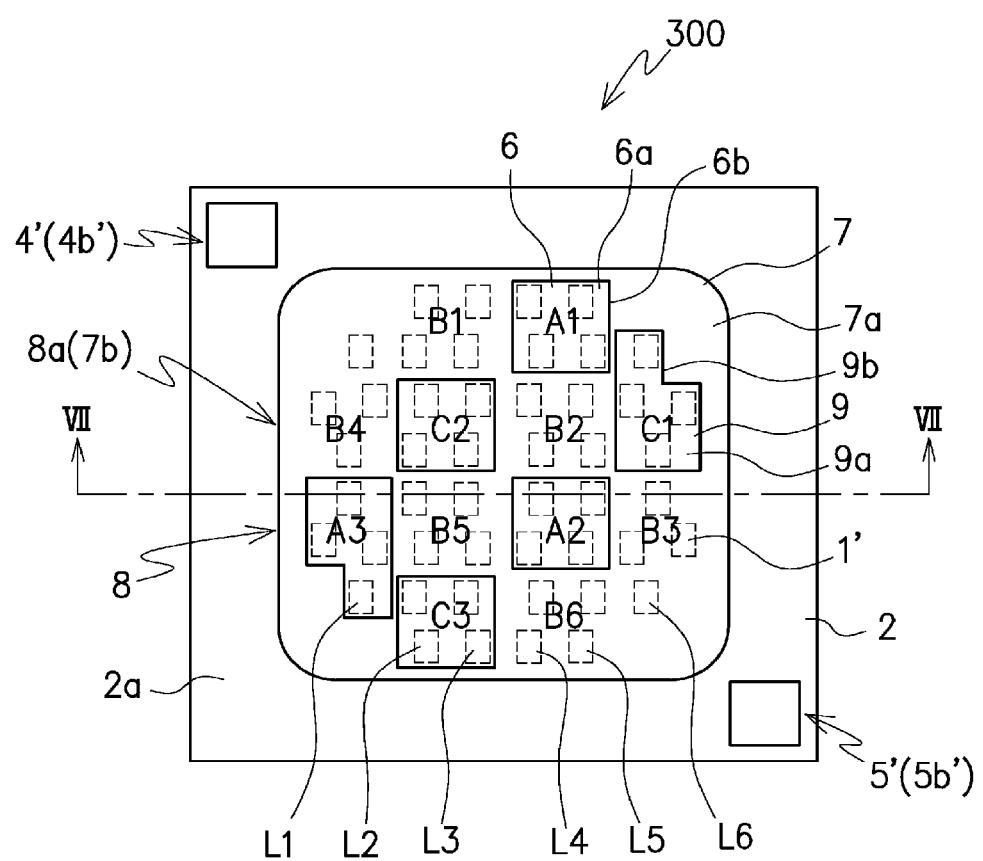
FIG. 6 shows a schematic top plan view of a lighting device according to a third embodiment of the present invention.

Furthermore, the light-emitting area 8 may be polygonal when viewed from above. The word "polygonal" here includes shapes of square, rectangle, pentagon, hexagon, and so on. Also, the light-emitting area 8 that is polygonal may be rounded at corners as shown in FIG. 6.

Figure 2A:
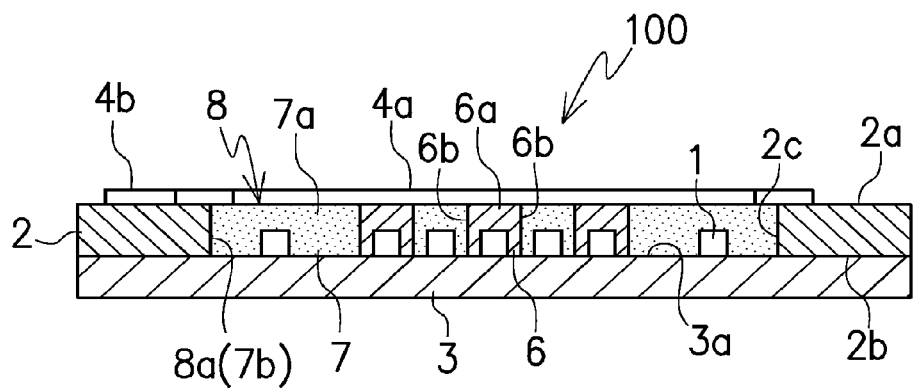
FIG. 2A shows a cross-sectional view of the lighting device taken along a line II-II shown in FIG. 1, showing a first variation of a substrate of the lighting device including a metal member on that light-emitting elements are arranged.

FIG. 2A shows a cross-sectional view of the lighting device taken along a line II-II shown in FIG. 1, showing a first variation of a substrate 2 of the lighting device 100. The substrate 2 includes a circuit board including a pass-through hole 2c that passes from an upper surface 2a of the circuit board 2 to a lower surface 2b of the circuit board 2, and further includes a metal member 3 arranged in contact with the lower surface 2b of the circuit board 2. The circuit board 2 may be made of resin.

The light-emitting elements 1 in groups L1-L2 can be arranged on an upper surface 3*a* of the metal member 3 within the pass-through hole 2*c* of the circuit board 2. The first electrode 4 partly arranged along the pass-through hole 2*c* of the circuit board 2. Also, the second electrode 5 partly arranged along the pass-through hole 2*c* of the circuit board 2. The first electrode portion 4*a* of the first electrode 4 and the second electrode portion 5*a* of the second electrode 5 are arranged on the upper surface 2*a* of the circuit board 2 along the pass-through hole 2*c* of the circuit board 2.

The first electrode portion 4*a* of the first electrode 4 and the second electrode portion 5*a* of the second electrode 5 are positioned opposite to each other across the pass-through hole 2*c* of the circuit board 2. The metal member 3 may be a metal plate made of aluminum, and the upper surface 3*a* of the metal member 3 may include anodized aluminum coating layer that can be electrically-insulating layer, for example. The metal member 3 may be a metal plate. As another variation, the metal member 3 may be a heat sink including fins to release heat generated from the light-emitting elements 1.

Figure 2B:
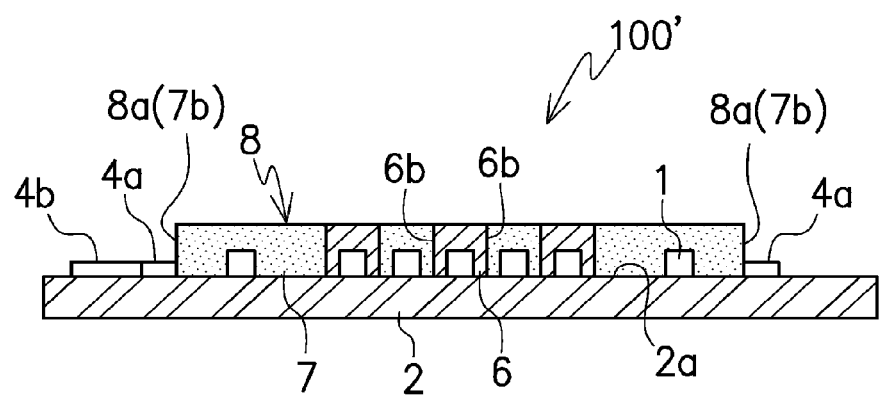
FIG. 2B shows a cross-sectional view of the lighting device taken along a line II-II shown in FIG. 1, showing a second variation of a substrate on that light-emitting elements are arranged.

FIG. 2B shows a cross-sectional view of the lighting device 100' taken along a line II-II shown in FIG. 1, showing a second variation of a substrate of the lighting device according to the first embodiment of the present invention.

As shown in FIG. 2B, the substrate 2 may be a ceramic substrate whose heat radiation rate can be higher than heat radiation rate of the substrate made of resin. The light-emitting elements 1 in groups L1-L2 can be arranged on an upper surface 2*a* of the substrate 2. The light-emitting elements 1 in each group may be electrically connected to one another in series by metallic wires 1*c* and electrically connected in series to the first electrode 4 and to the second electrode 5 at opposite ends of each group of light-emitting elements 1 by metallic wires 1*c*, as previously explained.

Furthermore, it is possible to arrange electrical contact portions 1*a* and 1*b* of the light-emitting elements 1 to be positioned at respective lower surfaces of the light-emitting elements 1 and to directly mount the light-emitting elements on electrode patterns formed on the upper surface of the substrate 2. This configuration of the substrate will be explained in the third embodiment 300 of lighting device shown in FIGS. 6-7B below.

Figure 3:
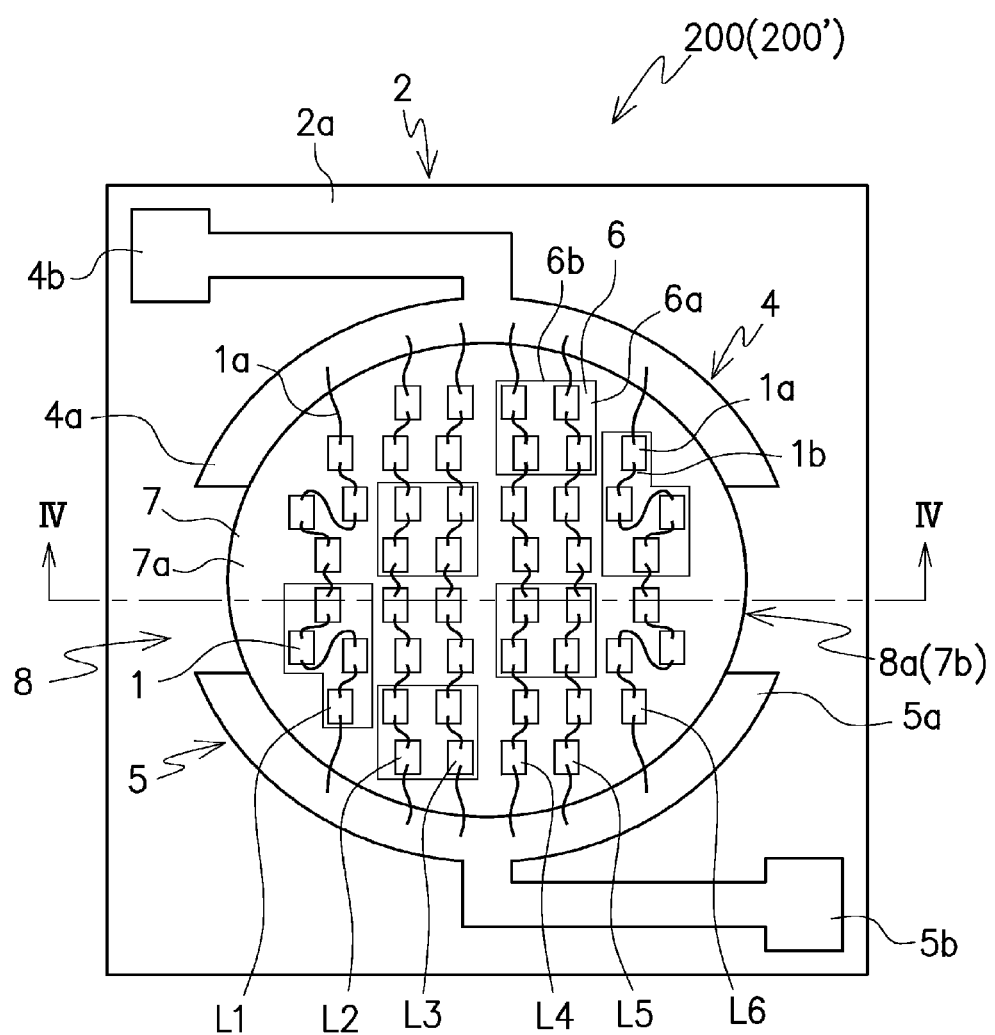
FIG. 3 shows a schematic top plan view of a lighting device according to a second embodiment of the present invention.

FIG. 3 shows a schematic top plan view of a lighting device according to a second embodiment of the present invention. A main difference between the lighting device 200 and the lighting device 200' is a configuration of a substrate and explained later with FIG. 4A and FIG. 4B.

A lighting device 200 or 200' includes a substrate 2 that includes a pair of electrodes as a first electrode 4 and a second electrode 5, groups L1-L6 each including a same number N of light-emitting elements 1 that are electrically connected to one another in series in each group of the groups L1, L2, L3, L4, L5 and L6 and that are arranged between the first electrode 4 and the second electrode 5 of the substrate 2, a first light-transmitting member 6 including a first phosphor 6*a* and covering at least one light-emitting element 1, and a second light-transmitting member 7 including a second phosphor 7*a* and covering at least one light-emitting element 1 that is uncovered by the first light-transmitting member 6.

The first phosphor 6*a* in the first light-transmitting member 6 and the second phosphor 7*a* in the second light-transmitting member 7 are configured to be excited to emit light with emission spectrum different from each other. Also, the first light-transmitting member 6 is enclosed by the second light-transmitting member 7.

Figure 5:
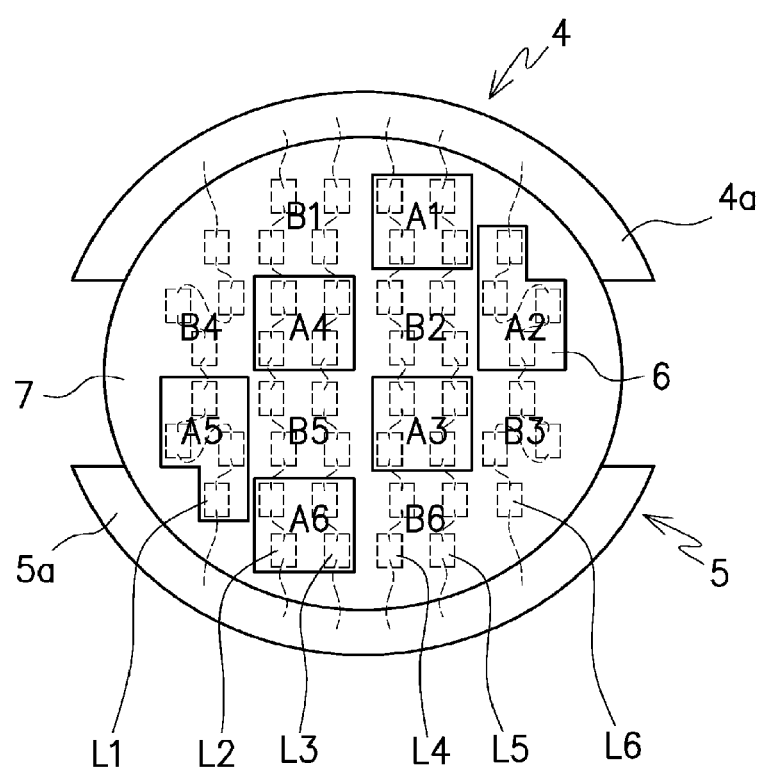
FIG. 5 is an explanatory view to show pieces of first light-transmitting member enclosed by the second light-transmitting member in a light-emitting area.

In this embodiment, some of the light-emitting elements 1 arranged in two or more groups of the groups L1-L6 and covered by one of the pieces A1-A6 of the first light-transmitting member 6, as shown in FIG. 5. For example, the piece A1 of the first light-transmitting member 6 covers two light-emitting elements 1 arranged in the group L4 and covers two light-emitting elements 1 arranged in the group L5. The piece A2 of the first light-transmitting member 6 covers four light-emitting elements 1 arranged in the group L6. Similarly to the piece A1, the piece A3 of the first light-transmitting member 6 covers two light-emitting elements 1 arranged in the group L4 and covers two light-emitting elements 1 arranged in the group L5. The piece A1 and the piece A3 are separately arranged from each other. Also, the piece A4 of the first light-transmitting member 6 covers two light-emitting elements arranged in the group L2 and covers two light-emitting elements 1 arranged in the group L3. The piece A5 of the first light-transmitting member 6 covers four light-emitting elements 1 arranged in the group L1. Similarly to the piece A4, the piece A6 of the first light-transmitting member 6 covers two light-emitting elements 1 arranged in the group L2 and covers two light-emitting elements 1 arranged in the group L3. The piece A4 and the piece A6 are separately arranged from each other.

The light-emitting area 8 can be dotted with pieces A1-A6 of the first light-transmitting member 6 that is enclosed by the second light-transmitting member 7. At least one piece of the pieces A1-A6 may appear to have a square shape, when viewed from above, as shown in FIG. 5.

Figure 4A:
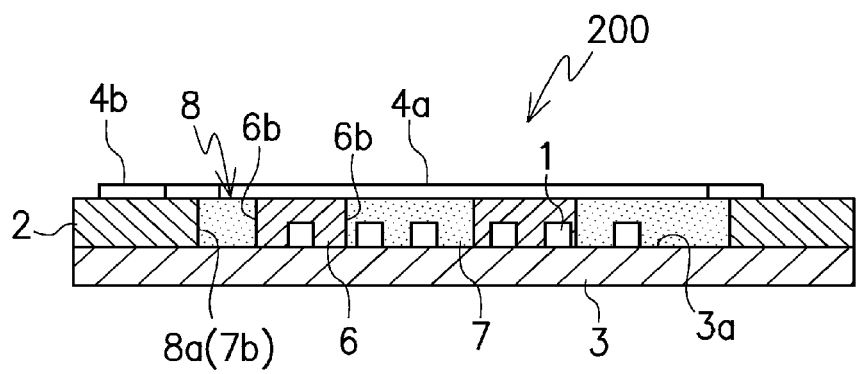
FIG. 4A shows a cross-sectional view of the lighting device taken along line IV-IV shown in FIG. 3, showing a first variation of a substrate of the lighting device including a metal member on that light-emitting elements are arranged.

FIG. 4A shows a cross-sectional view of the lighting device 200 taken along a line IV-IV shown in FIG. 3, as a first variation of a substrate of the lighting device 200 according to the second embodiment. The substrate 2 may include a circuit board having a pass-through hole 2*c* and further include a metal member arranged in contact with a lower surface of the circuit board 2. This configuration is already explained in the first embodiment of the lighting device 100 in FIG. 2A, and thus, repetition of explanation is omitted here.

Figure 4B:
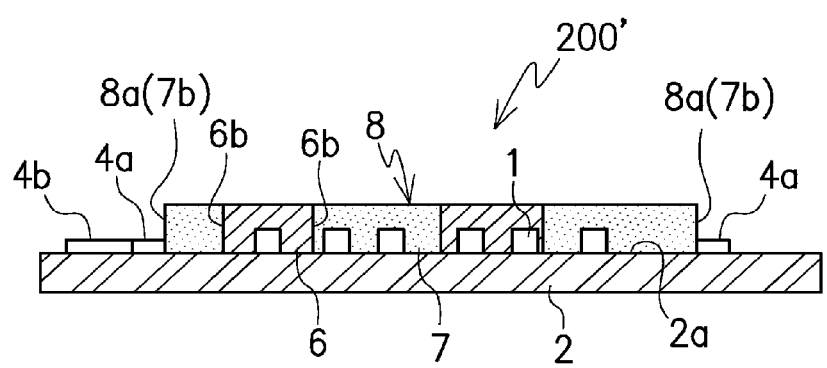
FIG. 4B shows a cross-sectional view of the lighting device taken along line IV-IV shown in FIG. 3, showing a second variation of a substrate on that light-emitting elements are arranged.

FIG. 4B shows a cross-sectional view of the lighting device 200' taken along a line IV-IV shown in FIG. 3, as a second variation of a substrate of the lighting device 200' according to the second embodiment of the present invention. The substrate 2 may be a ceramic substrate. This configuration is already explained in the first embodiment of the lighting device 100' in FIG. 2B, and thus, repetition of explanation is omitted here.

Figure 7A:
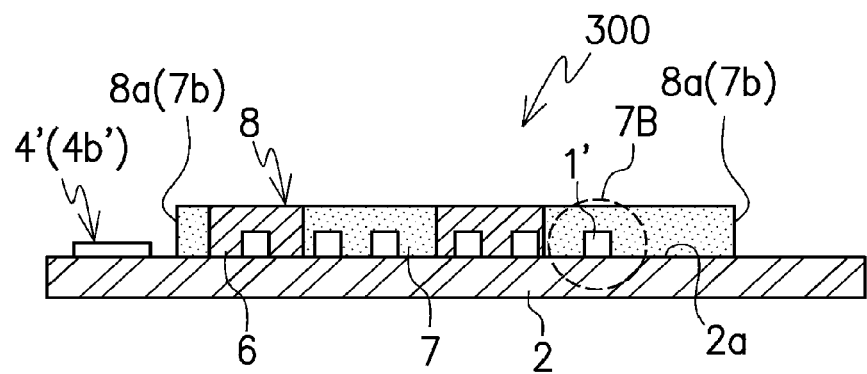
FIG. 7A shows a cross-sectional view of the lighting device taken along line VII-VII shown in FIG. 6.
Figure 7B:
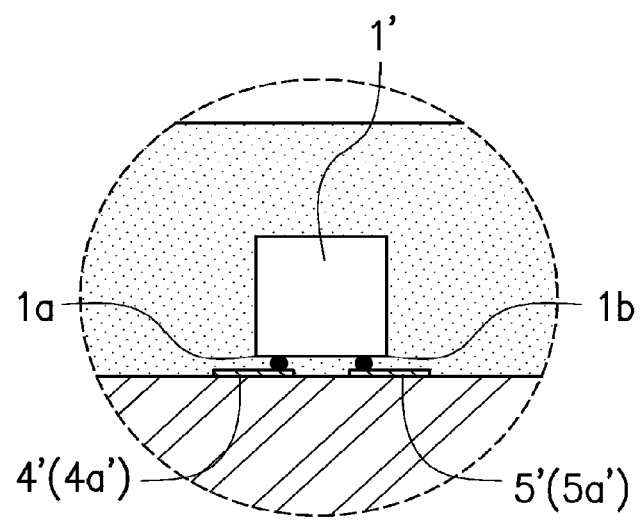
FIG. 7B is a partially enlarged cross-sectional view of 7B shown in FIG. 7A.

FIG. 6 shows a schematic top plan view of a lighting device according to a third embodiment of the present invention. FIG. 7A shows a cross-sectional view of the lighting device taken along line VII-VII shown in FIG. 6. FIG. 7B is a partially enlarged cross-sectional view of 7B shown in FIG. 7A.

A lighting device 300 includes a substrate 2 that includes a pair of electrodes as a first electrode 4' and a second electrode 5', groups L1-L6 each including a same number N of light-emitting elements 1 that are electrically connected to one another in series in each group of the groups L1, L2, L3, L4, L5 or L6 and that are arranged between the first electrode 4' and the second electrode 5' of the substrate 2, a first light-transmitting member 6 including a first phosphor 6*a* and covering at least one light-emitting element 1, and a second light-transmitting member 7 including a second phosphor 7*a* and covering at least one light-emitting element 1 that is uncovered by the first light-transmitting member 6. The first phosphor 6*a* in the first light-transmitting member 6 and the second phosphor 7*a* in the second light-transmitting member 7 are configured to be excited to emit light with emission spectrum different from each other. Also, the first light-transmitting member 6 is enclosed by the second light-transmitting member 7. In this embodiment, the lighting device 300 further includes a third light-transmitting member 9 including a third phosphor 9a. The third light-transmitting member covers at least one light-emitting element 1 that is uncovered by the first light-transmitting member 6 and the second light-transmitting member 7. The first phosphor 6a included in the first light-transmitting member 6 and the second phosphor 7a included in the first light-transmitting member 7 and the third phosphor 9a included in the third light-transmitting member 9 are configured to be excited to emit light with emission spectrum different from one another.

The first light-transmitting member 6 and the third light-transmitting member 9 are enclosed by the second light-transmitting member 7. The first light-transmitting member 6 is separately arranged as pieces A1-A3 from one another in the light-emitting area 8. Also, the third light-transmitting member 9 is separately arranged as pieces C1-C3 from one another in the light-emitting area 8.

Accordingly, the second light-transmitting member 7 is filled in a space between the pieces A1-A3 of the first light-transmitting member 6 and the pieces C1-C3 of the third light-transmitting member 9.

As shown in FIG. 6, a peripheral side surface 6b of the piece A1, A2, and/or A3 of the first light-transmitting member 6 enclosed by the second light-transmitting member 7 is in contact with the second light-transmitting member 7. Also, a peripheral side surface 9b of the piece C1, C2, and/or C3 of the third light-transmitting member 9 enclosed by the second light-transmitting member 7 is in contact with the second light-transmitting member 7. The light-emitting elements 1 that are positioned at B1-B6 covered by the second light-transmitting member 7 are integrally covered by the second light-transmitting member 7, and thus, the B1-B6 are not separated as pieces. As shown in FIG. 6, each of the pieces A1-A3 of the first light-transmitting member 6 and the pieces C1-C3 of the third light-transmitting member is adjacently arranged some of the light-emitting elements 1 covered by the second light-transmitting member 7.

Accordingly, the light-emitting area 8 can be dotted with the pieces A1-A3 of the first light-transmitting member 6 and the pieces C1-C3 of the third light-transmitting member 9. At least one piece of the first light-transmitting member 9 may appear to have a square shape, when viewed from above, as shown in FIG. 5. In this embodiment, there are four light-emitting elements 1 arranged in each piece of the first light-transmitting member 6 and the second light-transmitting member 9, but the number of the light-emitting elements 1 in the piece is not limited to the embodiments explained herein. It is possible to arrange more light-emitting elements 1 in each piece of the first light-transmitting member 6 and the third light-transmitting member 9.

Regarding electrical connection of the light-emitting elements 1 to the first electrode and the second electrode in the lighting device 300, it is possible to arrange the light-emitting elements 1 in each group of the groups L1, L2, L3, L4, L5 and L6 between the first electrode and the second electrode as shown in FIG. 5. In this embodiment, it is possible that electrical contact portions 1a and 1b of the light-emitting elements 1 may be positioned at respective lower surfaces of the light-emitting elements of the lighting device 300 shown in FIG. 7B. In this case, the light-emitting elements 1 can be directly arranged on the first electrode pattern 4a' and the second electrode pattern 5a' arranged on an upper surface 2a of the substrate 2. The substrate 2 in this embodiment may be a ceramic substrate. The first electrode 4' further includes a first terminal electrode portion 4b' electrically connected to the first electrode pattern 4a'. The second electrode 5' includes a second terminal electrode portion 5b' electrically connected to the second electrode pattern 5a'. The electrode pattern can be provided as printing and can be changed in accordance with arrangement of the light-emitting elements 1.

Figure 8:
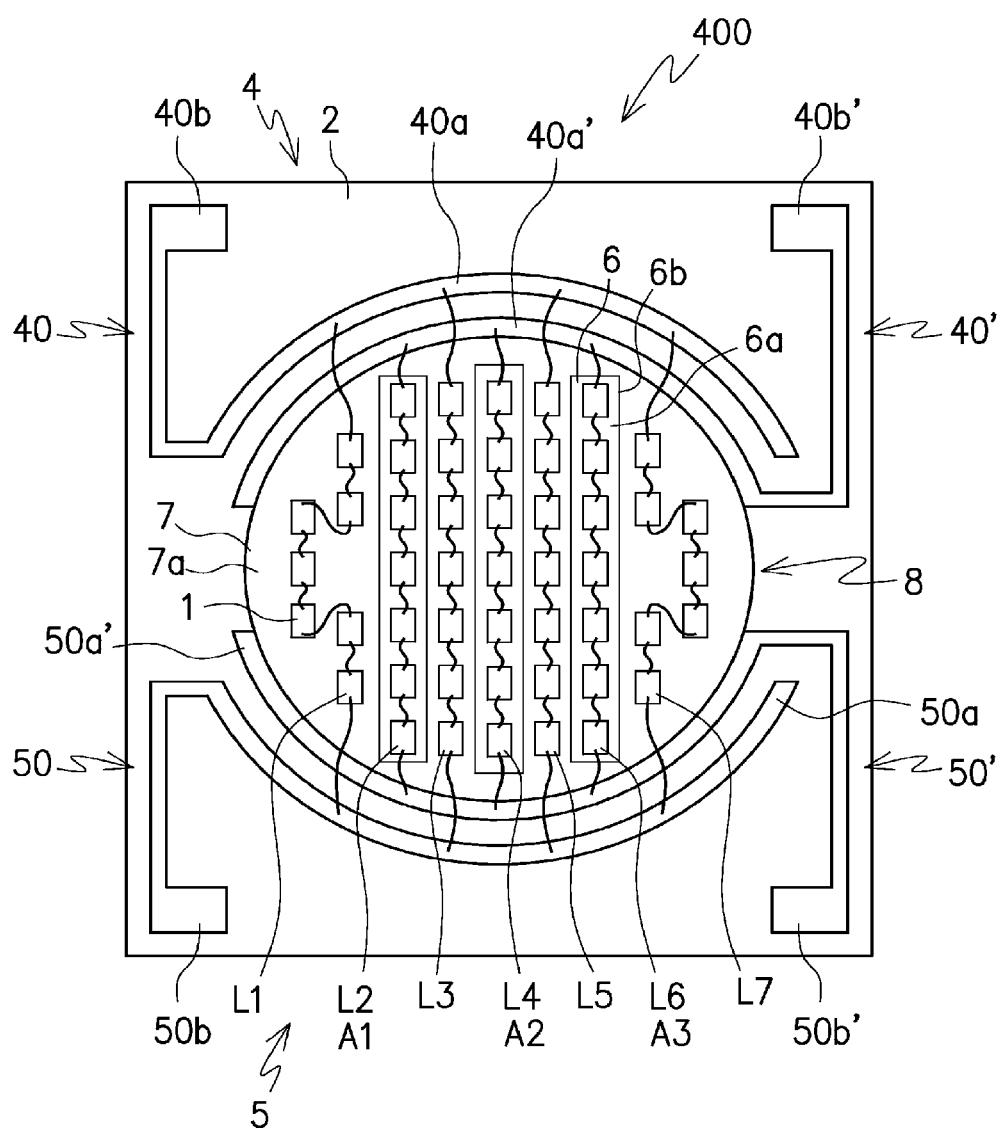
FIG. 8 shows a schematic top plan view of a lighting device according to a fourth embodiment of the present invention.

FIG. 8 shows a schematic top plan view of a lighting device 400 according to a fourth embodiment of the present invention.

As shown in FIG. 8, a main difference between the fourth embodiment and the first embodiment is that the lighting device 400 includes a substrate including two pairs of electrodes, while the lighting device 100 of the first embodiment includes a substrate including one pair of electrodes through which electrical current can be supplied.

The lighting device 400 includes a substrate including a first pair of electrodes as a first electrode 40 and a second electrode 50, and a second pair of electrodes as a first electrode 40' and a second electrode 50'. In the first pair 40 and 50, the first electrode 40 includes a first electrode portion 40a, and the second electrode 50 includes a second electrode portion 50a. The first electrode portion 40a and the second electrode portion 50a of the first pair 40 and 50 are positioned opposite to each other across the light-emitting area 8. Also, in the second pair 40' and 50', the first electrode 40' includes a first electrode portion 40a', and the second electrode 50' includes a second electrode portion 50a'. The first electrode portion 40a' and the second electrode portion 50a' of the second pair 40' and 50' are positioned opposite to each other across the light-emitting area 8.

The first electrode portion 40a of the first pair 40 and 50 is arranged in parallel with the first electrode portion 40a' of the second pair 40' and 50'. The first electrode portion 40a of the first pair 40 and 50 is positioned outside the first electrode portion 40a' of the second pair 40' and 50'. In this embodiment, the light-emitting area 8 has a circular shape. The first electrode portion 40a of the first pair and the first electrode portion 40a' of the second pair have circular arc shapes that extend separately from each other and partly in parallel with an outline 8a of the circular light-emitting area 8.

Also, the second electrode portion 50a of the first pair 40 and 50 is arranged in parallel with the second electrode portion 50a' of the second pair 40' and 50'. The second electrode portion 50a of the first pair 40 and 50 is positioned outside the second electrode portion 50a' of the second pair 40' and 50'. The second electrode portion 50a of the first pair and the second electrode portion 50a' of the second pair have circular arc shapes that extend separately from each other and partly in parallel with the outline 8a of the circular light-emitting area 8.

The first pair 40 and 50 further includes a first terminal electrode portion 40b electrically connected to the first electrode portion 40a and a second terminal electrode portion 50b electrically connected to the second electrode portion 50a.

Electrical current can be supplied through the first terminal electrode portions 40b and 40b' and the second terminal electrode portions 50b and 50b' of the first pair and the second pair of electrodes.

With this configuration, it is possible to modulate intensity of light from the light-emitting area 8 and/or intensity balance of color mixture. This is explained below with FIG. 9, as an example.

As previously explained, the main difference between the fourth embodiment and the first embodiment is the number of electrodes through which electrical current can be supplied, and thus, repetition of explanation is omitted here.

The lighting device 400 includes groups L1-L7 of the light-emitting elements 1. A first group L1 of the groups L1-L7 includes the N light-emitting elements 1 that are electrically connected to the first electrode portion 40a and to the second electrode portion 50a of the first pair of electrodes 40 and 50. A second group L2 of the groups L1-L7 includes the N light-emitting elements 1 that are electrically connected to the first electrode portion 40a' and to the second electrode portion 50a' of the second pair of electrodes 40' and 50'. The first group L1 is arranged next to the second group L2. A third group L3 of the groups L1-L7 includes the N light-emitting elements 1 that are electrically connected to the first electrode portion 40a and to the second electrode portion 50a of the first pair of electrodes 40 and 50. The third group L3 is arranged next to the second group L2. A fourth group L4 of the groups L1-L7 includes the N light-emitting elements 1 that are electrically connected to the first electrode portion 40a' and to the second electrode portion 50a' of the second pair of electrodes 40' and 50'. The fourth group L4 is arranged next to the third group L3. A fifth group L5 of the groups L1-L7 includes the N light-emitting elements 1 that are electrically connected to the first electrode portion 40a and to the second electrode portion 50a of the second pair of electrodes 40 and 50. The fifth group L5 is arranged next to the fourth group L4. A sixth group L6 of the groups L1-L7 includes the N light-emitting elements 1 that are electrically connected to the first electrode portion 40a' and to the second electrode portion 50a' of the second pair of electrodes 40' and 50'. The sixth group L4 is arranged next to the fifth group L5. A seventh group L7 of the groups L1-L7 includes the N light-emitting elements 1 that are electrically connected to the first electrode portion 40a and to the second electrode portion 50a of the second pair of electrodes 40 and 50. The seventh group L7 is arranged next to the sixth group L6.

Figure 9:
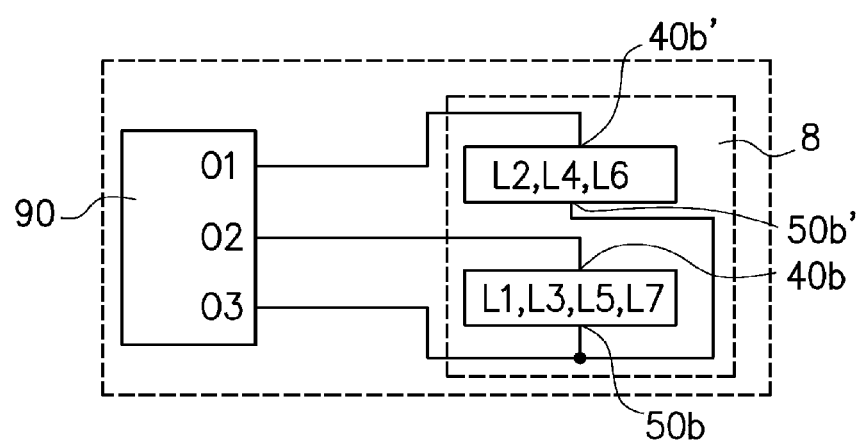
FIG. 9 shows a schematic view of electrical connection example between a control circuit 90 and a first pair of electrodes and a second pair of electrodes arranged partly along the light-emitting area 8 in that groups of the light-emitting elements 1 are arranged.

The lighting device 400 may be a lighting system electrically connected to a control circuit 90 that includes three terminals O1-O3, as shown in FIG. 9.

Accordingly, the first terminal electrode portion 40b' of the second pair 40' and 50' and the second terminal electrode portion 50b' of the second pair 40' and 50' can be electrically connected to the first terminal O1 and the third terminal O3 of the control circuit 90. Accordingly, electrical current can be supplied to the light-emitting elements 1 arranged in groups L2, L4, and L6.

Also, the first terminal electrode portion 40b of the first pair 40 and 50 and the second terminal electrode portion 50b of the second pair 40 and 50 can be electrically connected to the second terminal O2 and the third terminal O3 of the control circuit 90. Accordingly, electrical current can be supplied to the light-emitting elements 1 arranged in groups L1, L3, L5, and L7.

The light-emitting elements 1 in the lighting device 400 can be lighted together or selectively by a control circuit 90, which includes the three terminals O1-O3.

For example, when electrical current is supplied from the first terminal O1, electrical current can be selectively supplied to light-emitting elements 1 in groups L2, L4, and L6 covered by the first light-transmitting member 6 including the first phosphor 6a. The first phosphor 6a may be chosen to one that can be excited to emit warm color of light; red color, for example.

Also, when electrical current is supplied from the second terminal O2, electrical current can be selectively supplied to light-emitting elements 1 in groups L1, L3, L5 and L7 covered by the second light-transmitting member 7 including the second phosphor 7a. The second phosphor 7a may be chosen to one that can be excited to emit cool color of light; green color, for example.

Furthermore, when electrical current is simultaneously supplied from the first terminal O1 and from the second terminal O2 of the control circuit 90, the light-emitting elements 1 in groups L2, L4, and L6 for warm color of light and the light-emitting elements 1 in groups L1, L3, L5 and L7 for cool color of light can be lighted together.

Accordingly, it is possible to change intensity of light from the light-emitting area 8 and/or intensity balance of color mixture.

Figure 10:
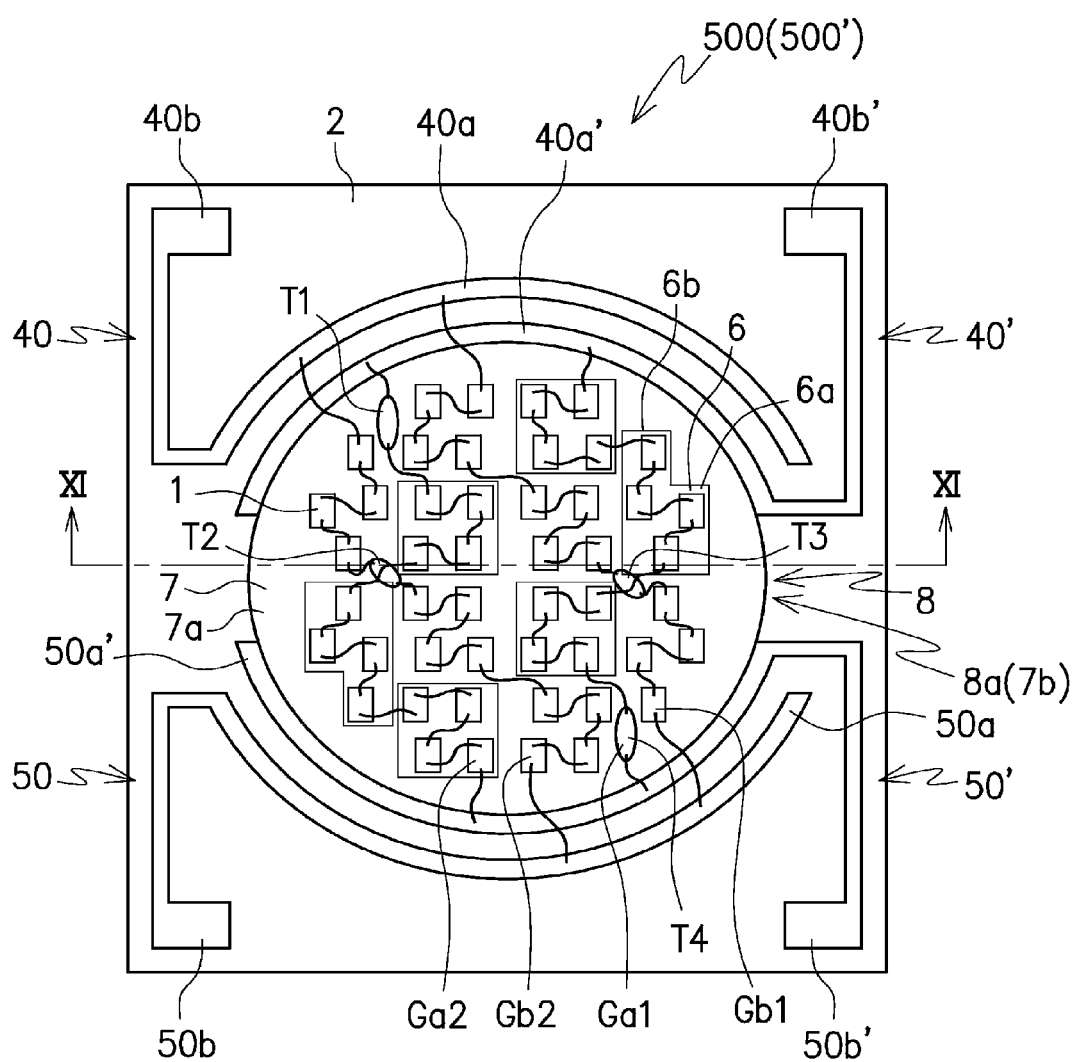
FIG. 10 shows a schematic top plan view of a lighting device according to a fifth embodiment of the present invention.

FIG. 10 shows a schematic top plan view of a lighting device 500 or 500' according to a fifth embodiment of the present invention. The difference between the lighting device 500 and the lighting device 500' is a configuration of a substrate and explained later with FIG. 11A and FIG. 11B.

A main difference between the lighting device 200(200') explained with FIG. 3 and a lighting device 500(500') of this embodiment is that the lighting device 500(500') includes a substrate including two pairs of electrodes, while the lighting device 200 (200') of the first embodiment includes a substrate including one pair of electrodes through which electrical current can be supplied. Another difference between the lighting device 200 (200') and the lighting device 500 (500') is that the lighting device 500 or 500' includes a smaller electrode that is smaller in size than the first electrode 40 or 40' or the second electrode 50 or 50'. The smaller electrode can be positioned among the light-emitting elements 1 arranged in groups. In this embodiment, there are four smaller electrodes T1-T4 arranged in the light-emitting area 8, but the number of the smaller electrodes is not limited to this embodiment. One or more smaller electrodes can be arranged in accordance with necessity.

Figure 11A:
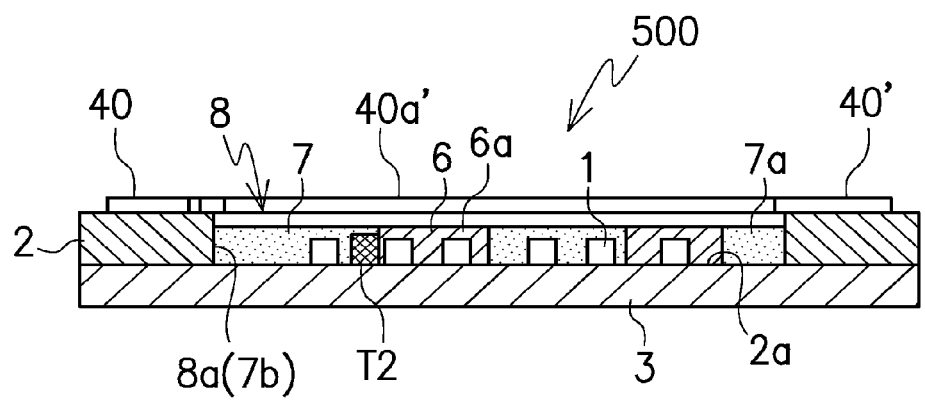
FIG. 11A shows a cross-sectional view of the lighting device taken along line XI-XI shown in FIG. 10, showing a first variation of a substrate of the lighting device including a metal member on that light-emitting elements are arranged.

FIG. 11A shows a cross-sectional view of the lighting device taken along line XI-XI shown in FIG. 10 as a first variation of a substrate of the lighting device 500 according to the fifth embodiment of the present invention. The substrate includes a metal member 3 on that the light-emitting elements 1 are arranged. This configuration is already explained in the first embodiment of the lighting device 100 in FIG. 2A, and thus, repetition of explanation is omitted here.

Figure 11B:
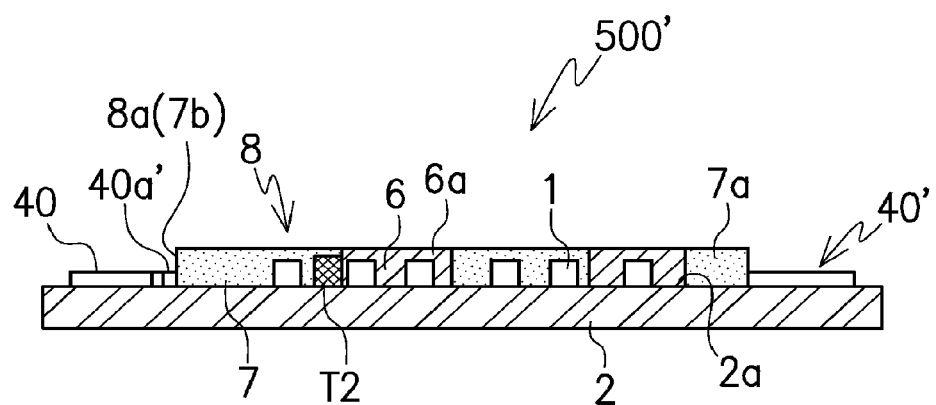
FIG. 11B shows a cross sectional view of the lighting device taken along line XI-XI shown in FIG. 10, showing a second variation of a substrate on that light-emitting elements are arranged.

FIG. 11B shows a cross sectional view of the lighting device 500' taken along line XI-XI shown in FIG. 10 as a second variation of a substrate of the lighting The light-emitting elements are arranged on an upper surface of the substrate. This configuration is already explained in the first embodiment of the lighting device 100' in FIG. 2B, and thus, repetition of explanation is omitted here.

Furthermore, the lighting device 500 or 500' includes a substrate including a first pair of electrodes as a first electrode 40 and a second electrode 50, and a second pair of electrodes as a first electrode 40' and a second electrode 50'. Since this configuration is already explained in the fourth embodiment of the lighting device 400, repetition of explanation is omitted here.

The lighting device 500 or 500' includes groups Ga1, Ga2, Gb1 and Gb2 each including a same number N of light-emitting elements 1 that are electrically connected to one another in series in each group Ga1, Ga2, Gb1 and Gb2. In this embodiment, a first group Gb1 includes twelve light-emitting elements 1 that are electrically connected to the first electrode portion 40a and to the second electrode portion 50a of the first pair through the third smaller electrode T3. Also, a second group Ga1 includes twelve light-emitting elements 1 that are electrically connected to the first electrode portion 40a' and to the second electrode portion 50a' of the second pair through the fourth smaller electrodes T3 and T4. The second group Ga1 is arranged next to the first group Gb1, and pieces A1-A3 of the first light-transmitting member 6 covering the light-emitting elements 1 in the second group Ga1 are arranged alternately with the light-emitting elements of the first group Gb1 positioned at B1-B3 in the second light-transmitting member 7.

A third group Gb2 includes twelve light-emitting elements 1 that are electrically connected to the first electrode portion 40a and to the second electrode portion 50a of the first pair through the third smaller electrode T2. The third group Gb2 is arranged next to the second group Ga1. Furthermore, a fourth group Ga2 includes twelve light-emitting elements 1 that are electrically connected to the first electrode portion 40a' and to the second electrode portion 50a' of the second pair through the fourth smaller electrodes T1 and T2. The fourth group Ga2 is arranged next to the third group Gb2, and pieces A4-A6 of the first light-transmitting member 6 covering the light-emitting elements 1 in the fourth group Ga2 are arranged alternately with the light-emitting elements of the third group Gb2 positioned at B4-B6 in the second light-transmitting member 7.

Accordingly, the light-emitting area 8 can be dotted with the pieces A1-A6 of the first light-transmitting member 6. Since the arrangement of the pieces A1-A6 can be well-balanced in relationship with the light-emitting elements 1 covered by the second light-transmitting member 7.

As explained above, the smaller electrode can be arranged as an intermediate electrode used for electrical connections of two or more groups, when electrical connection of one group of light-emitting elements 1 crosses an electrical connection of another group of light-emitting elements 1 (For example, see the smaller electrodes T2 and T3 shown in FIG. 10). Also, the smaller electrode can be arranged as an intermediate electrode when a light-emitting element configured to be electrically connected to a first electrode 4 or a second electrode 5 by metallic wire is positioned away from the first electrode 4 or the second electrode 5 (For example, see the smaller electrodes T1 and T4 shown in FIG. 10).

As shown in FIG. 11A, when the first variation of the substrate including a metal member 3 is used, the metal member 3 can be treated to be electrically insulating with respect to the light-emitting elements 1. For example, the metal member 3 may be a metal plate made of aluminum, and the upper surface 3a of the metal member 3 may include anodized aluminum coating layer that can be electrically-insulating layer. The smaller electrode can be arranged on the electrically-insulating layer arranged on the upper surface 3a of the metal member 3.

Figure 12:
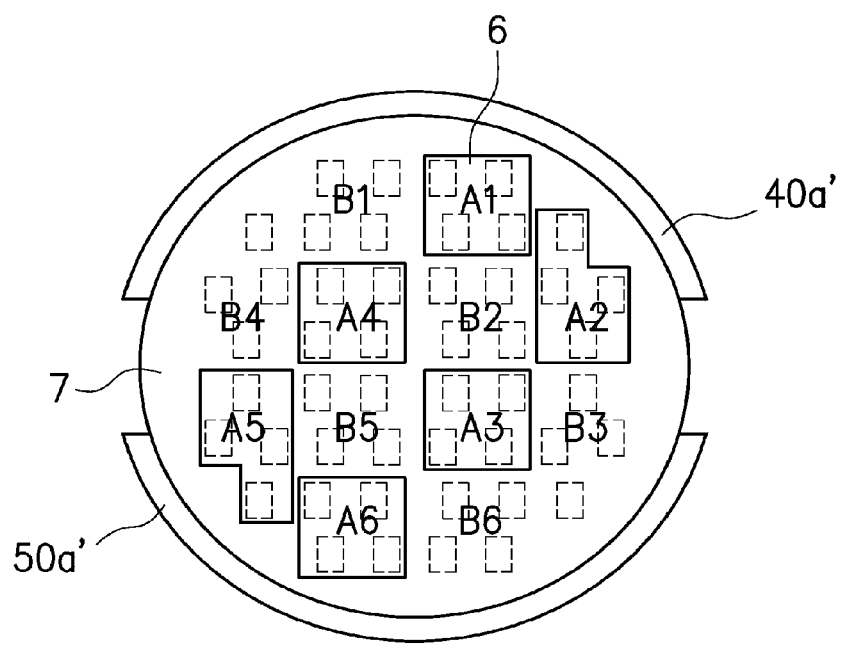
FIG. 12 is an explanatory view to show pieces of first light-transmitting member enclosed by the second light-transmitting member in a light-emitting area.

FIG. 12 is an explanatory partial view to showpieces A1-A6 of the first light-transmitting member 6 arranged in the second light-transmitting member 7 of the lighting device 500 or 500' with omitted parts. The light-emitting elements 1 that are positioned at B1-B6 covered by the second light-transmitting member 7 shown in FIG. 12 are integrally covered by the second light-transmitting member 7, and thus, the B1-B6 are not separated as pieces. FIG. 12 shows that the light-emitting area is dotted with the pieces A1-A6 of the first light-transmitting member. The pieces A1-A6 of the first light-transmitting member 6 covering the first light-emitting elements 1 may be evenly arranged in relation to the light-emitting elements 1 covered by the second light-transmitting member 7.

Figure 13:
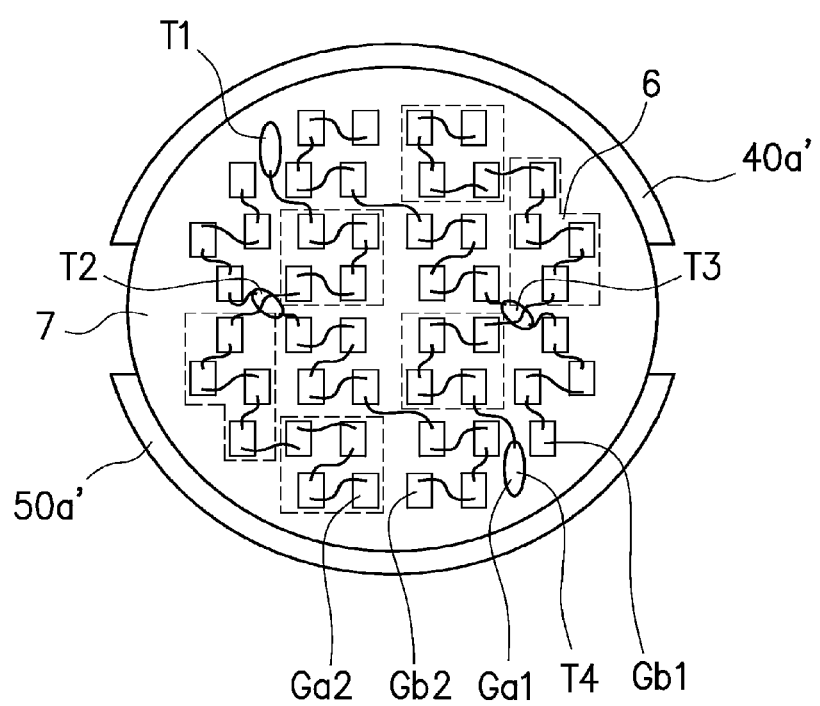
FIG. 13 is an explanatory view to show electrical connection of metallic wires connecting the light-emitting elements arranged in groups.

FIG. 13 is an explanatory view to show electrical connection of metallic wires connecting the light-emitting elements 1 of the lighting device 500 or 500' shown in FIG. 10. FIG. 13 shows the electrical connection of metallic wires connecting the light-emitting elements 1 in groups Ga1, Ga2, Gb1, and Gb2 and in the pieces A1-A6 of the first light-transmitting member 6 to be more visible with omitted parts.

Figure 14:
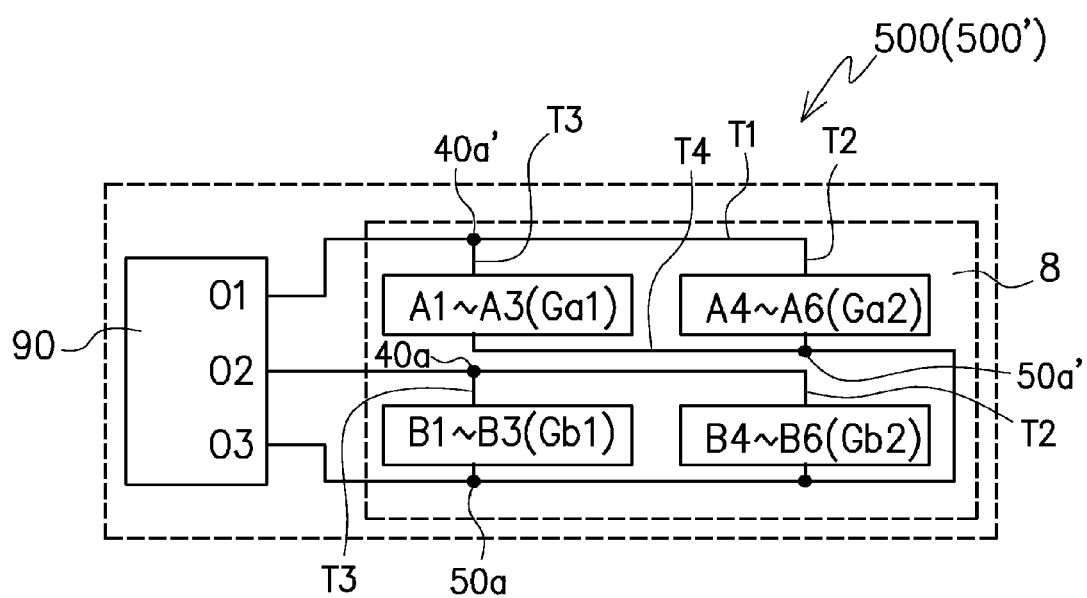
FIG. 14 shows a schematic view of electrical connection example between a control circuit 90 and a first pair of electrodes and a second pair of electrodes.

FIG. 14 shows a schematic view of electrical connection example between a control circuit 90 and a first pair of electrodes 40 and 50 and a second pair of electrodes 40' and 50' of the lighting device 500 or 500'. Also, the first electrode portions 40a and 40a' and the second electrode portions 50a, and 50a' arranged partly along the light-emitting area 8 and smaller electrodes T1-T4 arranged in the light-emitting area 8 are shown in FIG. 14, and also, electrical connections of groups Ga1, Ga2, Gb1, and Gb2 of the light-emitting elements are shown.

The lighting device 500 or 500' may be a lighting system electrically connected to a control circuit 90 that includes three terminals O1-O3, as shown in FIG. 10.

Accordingly, the first terminal electrode portion 40b' of the second pair 40' and 50' and the second terminal electrode portion 50b' of the second pair 40' and 50' can be electrically connected to the first terminal O1 and the third terminal O3 of the control circuit 90. Accordingly, electrical current can be supplied to the light-emitting elements 1 arranged in groups Ga1 and Ga2. The light-emitting elements 1 in the second group Ga1 are arranged in pieces A1-A3 of the first light-transmitting member 6. Also, the light-emitting elements 1 in the fourth group Ga2 are arranged in pieces A4-A6 of the first light-transmitting member 6.

Also, the first terminal electrode portion 40b of the first pair 40 and 50 can be electrically connected to the second terminal O2 and the second terminal electrode portion 50b of the first pair 40 and 50 can be electrically connected to the third terminal O3 of the control circuit 90. Accordingly, electrical current can be supplied to the light-emitting elements 1 arranged in groups Gb1 and Gb2. The light-emitting elements 1 in the first group Gb1 are arranged at B1-B3 of the second light-transmitting member 7. Also, the light-emitting elements 1 in the third group Gb2 are arranged at B4-B6 of the second light-transmitting member 7.

The light-emitting elements 1 in the lighting device 500 or 500' can be lighted together or selectively by a control circuit 90, which includes the three terminals O1-O3.

For example, when electrical current is supplied from the first terminal O1, electrical current can be selectively supplied to light-emitting elements 1 in groups Ga1 and Ga2 covered by the first light-transmitting member 6 including the first phosphor 6a. The first phosphor 6a may be chosen to one that can be excited to emit warm color of light; red color, for example.

Also, when electrical current is supplied from the second terminal O2, electrical current can be selectively supplied to light-emitting elements 1 in groups Gb1 and Gb2 covered by the second light-transmitting member 7 including the second phosphor 7a. The second phosphor 7a may be chosen to one that can be excited to emit cool color of light; green color, for example.

Furthermore, when electrical current is simultaneously supplied from the first terminal O1 and from the second terminal O2 of the control circuit 90, the light-emitting elements 1 in groups Ga1 and Ga2 for warm color of light and the light-emitting elements 1 in groups Gb1 and Gb2 for cool color of light can be lighted together.

Accordingly, it is possible to change intensity of light from the light-emitting area 8 and/or intensity balance of color mixture. As previously mentioned, a combination of first phosphor 6a included in the first light-transmitting member 6 and second phosphor 7a included in the second light-transmitting member 7 is not limited to embodiments explained herein. Various combinations of phosphors can be used for a lighting device. Also, it is possible that the first light-transmitting member may include one or more phosphors in addition to the first phosphor. Furthermore, it is possible that the second light-transmitting member may include one or more phosphors in addition to the second phosphor.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:

1. A lighting device comprising:
a substrate comprising a pair of electrodes as a first electrode and a second electrode;
light-emitting elements arranged in an area of the substrate and electrically connected to the first electrode and the second electrode of the substrate;
a first light-transmitting member comprising a first phosphor and covering at least one light-emitting element; and
a second light-transmitting member comprising a second phosphor and covering at least one light-emitting element that is uncovered by the first light-transmitting member,
the first phosphor comprised in the first light-transmitting member and the second phosphor comprised in the second light-transmitting member being configured to be excited to emit light with emission spectrum different from each other, and
the first light-transmitting member being enclosed by the second light-transmitting member, and the first light-transmitting member and the second light-transmitting member constituting an integrated circular light-emitting area of the lighting device.

2. A lighting device comprising:
a substrate comprising a pair of electrodes as a first electrode and a second electrode;
light-emitting elements arranged in an area of the substrate and electrically connected to the first electrode and the second electrode of the substrate;
a first light-transmitting member comprising a first phosphor and covering at least one light-emitting element;
a second light-transmitting member comprising a second phosphor and covering at least one light-emitting element that is uncovered by the first light-transmitting member; and
a third light-transmitting member comprising a third phosphor and covering at least one light-emitting element that is uncovered by the first light-transmitting member and the second light-transmitting member,
the first phosphor comprised in the first light-transmitting member, the second phosphor comprised in the second light-transmitting member, and the third phosphor comprised in the third light-transmitting member being configured to be excited to emit light with emission spectrum different from each other, and
the first light-transmitting member and the third light-transmitting member being enclosed by the second light-transmitting member, and the first light-transmitting member, the second light-transmitting member, and the third light-transmitting member constituting an integrated light-emitting area of the lighting device.

3. A lighting device comprising:
a substrate comprising two pairs of electrodes as a first pair of electrodes and a second pair of electrodes;
light-emitting elements arranged in a circular area of the substrate and electrically connected to at least one pair of the two pairs of electrodes;
a first light-transmitting member comprising a first phosphor and covering at least one light-emitting element; and
a second light-transmitting member comprising a second phosphor and covering at least one light-emitting element that is uncovered by the first light-transmitting member;
the first phosphor comprised in the first light-transmitting member and the second phosphor comprised in the second light-transmitting member being configured to be excited to emit light with emission spectrum different from each other, and
the first light-transmitting member being enclosed by the second light-transmitting member, the first light-transmitting member and the second light-transmitting member constituting an integrated light-emitting area of the lighting device, and
the light-emitting elements covered by the first light-transmitting member being electrically connected to the first pair of electrodes, and the light-emitting elements covered by the second light-transmitting member being electrically connected to the second pair of electrodes.

4. The lighting device according to claim 3,
wherein the first pair of electrodes comprises a first electrode portion and the second pair of electrodes comprises a first electrode portion, and
wherein the first electrode portion of the first pair of electrodes and the first electrode portion of the second pair of electrodes comprise circular arc shapes that extend separately from each other and in parallel with at least a part of an outline of the circular area of the substrate.

5. A lighting device comprising:
a substrate comprising a pair of electrodes as a first electrode and a second electrode;
a first light-transmitting member comprising a first phosphor and covering at least one light-emitting element; and
a second light-transmitting member comprising a second phosphor and covering at least one light-emitting element that is uncovered by the first light-transmitting member,
the first phosphor comprised in the first light-transmitting member and the second phosphor comprised in the second light-transmitting member being configured to be excited to emit light with emission spectrum different from each other, and the first light-transmitting member being enclosed by the second light-transmitting member.

6. The lighting device according to claim 5,
wherein an outline of the second light-transmitting member coincides with an outline of a light-emitting area.

7. The lighting device according to claim 6,
wherein the first electrode and the second electrode are positioned opposite to each other across the light-emitting area and adjacently positioned to the outline of the light-emitting area.

8. The lighting device according to claim 6,
wherein the light-emitting area is circular when viewed from above.

9. The lighting device according to claim 6,
wherein the first light-transmitting member is separately arranged as pieces from one another in the light-emitting area.

10. The lighting device according to claim 9,
wherein the pieces of the first light-transmitting member are arranged in parallel with one another between the first electrode and the second electrode.

11. The lighting device according to claim 9,
wherein some of the light-emitting elements are covered by at least one of the pieces of the first light-transmitting member.

12. The lighting device according to claim 9,
wherein the light-emitting area is dotted with the pieces of the first light-transmitting member.

13. The lighting device according to claim 9,
wherein the second light-transmitting member is filled in a space between the pieces of the first light-transmitting member.

14. The lighting device according to claim 5 further comprising:
a third light-transmitting member comprising a third phosphor and covering at least one light-emitting element that is uncovered by the first light-transmitting member and the second light-transmitting member,
wherein the first phosphor comprised in the first light-transmitting member and the second phosphor comprised in the second light-transmitting member and the third phosphor comprised in the third light-transmitting member are configured to be excited to emit light with emission spectrum different from one another.

15. The lighting device according to claim 14,
wherein the third light-transmitting member is separately arranged as pieces from one another in the light-emitting area.

16. The lighting device according to claim 15,
wherein the second light-transmitting member is filled in a space between the pieces of the first light-transmitting member and the pieces of the third light-transmitting member.

17. The lighting device according to claim 5 further comprising:
a second pair of electrodes comprising a first electrode and a second electrode, while the pair of electrodes is defined as a first pair of electrodes,
wherein the first electrode of the first pair of electrodes comprises a first electrode portion, and the first electrode of the second pair of electrodes comprises a first electrode portion that is arranged in parallel with the first electrode portion of the first pair of electrodes, and
wherein the second electrode of the first pair of electrodes comprises a second electrode portion, and the second electrode of the second pair of electrodes comprises a second electrode portion that is arranged in parallel with the second electrode portion of the first pair of electrodes.

18. The lighting device according to claim 17 further comprising:
a control circuit comprising a first terminal electrically connected to the first pair of electrodes and a second terminal electrically connected to the second pair of electrodes.

19. The lighting device according to claim 5 further comprising:
a smaller electrode that is smaller in size than the first electrode or the second electrode, and the smaller electrode being positioned among the light-emitting elements.

20. The lighting device according to claim 5 further comprising:
a smaller electrode that is smaller in size than the first electrode or the second electrode of the pair of electrodes,
wherein the smaller electrode can be an intermediate electrode to electrically connect the light-emitting elements comprised in a first group.

21. The lighting device according to claim 20,
wherein the smaller electrode can be an intermediate electrode to electrically connect the light-emitting elements comprised in a second group.

22. The lighting device according to claim 5,
wherein the substrate is a ceramic substrate on that the light-emitting elements are arranged.

23. The lighting device according to claim 5,
wherein the substrate comprises a circuit board having a hole penetrating from an upper surface to a lower surface of the circuit board and further comprises a metal member arranged in contact with the lower surface of the circuit board, and the light-emitting elements are mounted on an upper surface of the metal member within the pass-through hole of the circuit board.

* * * * *